United States Patent
Howell et al.

(10) Patent No.: US 9,202,906 B2
(45) Date of Patent: Dec. 1, 2015

(54) SUPERLATTICE CRENELATED GATE FIELD EFFECT TRANSISTOR

(71) Applicants: Robert S. Howell, Silver Spring, MD (US); Eric J. Stewart, Silver Spring, MD (US); Bettina A. Nechay, Annapolis, MD (US); Justin A. Parke, Ellicott City, MD (US); Harlan C. Cramer, Columbia, MD (US); Jeffrey D. Hartman, Severn, MD (US)

(72) Inventors: Robert S. Howell, Silver Spring, MD (US); Eric J. Stewart, Silver Spring, MD (US); Bettina A. Nechay, Annapolis, MD (US); Justin A. Parke, Ellicott City, MD (US); Harlan C. Cramer, Columbia, MD (US); Jeffrey D. Hartman, Severn, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 13/802,747

(22) Filed: Mar. 14, 2013

(65) Prior Publication Data
US 2014/0264273 A1    Sep. 18, 2014

(51) Int. Cl.
| | |
|---|---|
| *H01L 29/06* | (2006.01) |
| *H01L 29/778* | (2006.01) |
| *H01L 29/417* | (2006.01) |

(Continued)

(52) U.S. Cl.
CPC ........ *H01L 29/7784* (2013.01); *H01L 29/1029* (2013.01); *H01L 29/155* (2013.01); *H01L 29/41766* (2013.01); *H01L 29/66462* (2013.01); *H01L 29/2003* (2013.01)

(58) Field of Classification Search
CPC ........................ H01L 29/0665; H01L 29/0673
USPC ............................................................ 257/20
See application file for complete search history.

(56) References Cited

U.S. PATENT DOCUMENTS

| | | |
|---|---|---|
| 4,583,107 A | 4/1986 | Clarke |
| 6,486,511 B1 | 11/2002 | Nathanson et al. |

(Continued)

FOREIGN PATENT DOCUMENTS

KR    20120010512 A    2/2012

OTHER PUBLICATIONS

T. Palacios, et al., "Use of Double-Channel Heterostructures to Improve the Access Resistance and Linearity in GaN-Based HEMTs", IEEE Transactions on Electron Devices, vol. 53, No. 3, pp. 562-565 (Mar. 2006).

(Continued)

*Primary Examiner* — Thao X Le
*Assistant Examiner* — Patricia Reddington
(74) *Attorney, Agent, or Firm* — Clifford L. Tager; Harry Lupuloff; Suzanne J. Heeg

(57) ABSTRACT

The present invention is directed to a device comprising an epitaxial structure comprising a superlattice structure having an uppermost 2DxG channel, a lowermost 2DxG channel and at least one intermediate 2DxG channel located between the uppermost and lowermost 2DxG channels, source and drain electrodes operatively connected to each of the 2DxG channels, and a plurality of trenches located between the source and drain electrodes. Each trench has length, width and depth dimensions defining a first sidewall, a second sidewall and a bottom located therebetween, the bottom of each trench being at or below the lowermost 2DxG channel. A crenelated gate electrode is located over the uppermost 2DxG channel, the gate electrode being located within each of the trenches such that the bottom surface of the gate electrode is in juxtaposition with the first sidewall surface, the bottom surface and the second sidewall surface of each of said trenches.

20 Claims, 15 Drawing Sheets

(51) Int. Cl.
*H01L 29/66* (2006.01)
*H01L 29/10* (2006.01)
*H01L 29/15* (2006.01)
*H01L 29/20* (2006.01)

(56) References Cited

U.S. PATENT DOCUMENTS

| | | | |
|---|---|---|---|
| 8,035,128 | B2 | 10/2011 | Ikeda et al. |
| 8,039,329 | B2 | 10/2011 | Nakazawa et al. |
| 8,044,409 | B2 | 10/2011 | Yu et al. |
| 8,076,699 | B2 * | 12/2011 | Chen et al. .................. 257/194 |
| 8,124,505 | B1 | 2/2012 | Burnham et al. |
| 8,124,957 | B2 | 2/2012 | Ibbetson et al. |
| 8,125,004 | B2 | 2/2012 | Kaneko |
| 8,148,712 | B2 | 4/2012 | Miki et al. |
| 8,159,002 | B2 | 4/2012 | Tilak et al. |
| 2005/0189584 | A1 | 9/2005 | Matsuda |
| 2007/0114567 | A1 * | 5/2007 | Matocha et al. ............. 257/192 |
| 2008/0315256 | A1 * | 12/2008 | Ohta et al. ................... 257/194 |
| 2009/0045438 | A1 | 2/2009 | Inoue et al. |
| 2011/0079771 | A1 | 4/2011 | Kanamura et al. |
| 2011/0097837 | A1 | 4/2011 | Garcia et al. |
| 2011/0108850 | A1 | 5/2011 | Cheng et al. |
| 2011/0140121 | A1 | 6/2011 | Lee et al. |
| 2011/0156050 | A1 | 6/2011 | Okada et al. |
| 2011/0180806 | A1 | 7/2011 | Hebert |
| 2011/0186859 | A1 | 8/2011 | Ohki |
| 2011/0189826 | A1 | 8/2011 | Mita et al. |
| 2011/0198669 | A1 | 8/2011 | Kaya et al. |
| 2011/0204380 | A1 | 8/2011 | Yoshioka et al. |
| 2011/0227090 | A1 | 9/2011 | Briere |
| 2011/0233613 | A1 | 9/2011 | Jeon et al. |
| 2011/0254055 | A1 | 10/2011 | Sato et al. |
| 2011/0297961 | A1 | 12/2011 | Bunin et al. |
| 2011/0316048 | A1 | 12/2011 | Ikeda |
| 2011/0318913 | A1 | 12/2011 | Ikeda |
| 2012/0058613 | A1 | 3/2012 | Oh et al. |
| 2012/0074504 | A1 | 3/2012 | Sato et al. |
| 2012/0086077 | A1 | 4/2012 | Fried |
| 2012/0086497 | A1 | 4/2012 | Vorhaus |
| 2012/0088360 | A1 | 4/2012 | Kim et al. |
| 2012/0091513 | A1 | 4/2012 | Saimei et al. |
| 2012/0097950 | A1 | 4/2012 | Son et al. |
| 2012/0104490 | A1 | 5/2012 | Yilmaz et al. |
| 2012/0108024 | A1 | 5/2012 | Chang et al. |
| 2012/0217506 | A1 | 8/2012 | Briere |

OTHER PUBLICATIONS

R. Chu, "AlGaN—GaN Double-Channel HEMTs", IEEE Transactions on Electron Devices, vol. 52, No. 4, pp. 438-446 (Apr. 2005).
S. Heikman, et al., "High conductivity modulation doped AGaN/GaN multiple channel heterostructures", J. of Applied Physics, vol. 94, No. 8, pp. 5321-5325 (Oct. 15, 2003).
N.H. Sheng, et al., "Multiple-Channel GaAs/AlGaAs High Electron Mobility Transistors", IEEE Electron Device Letters, vol. EDL-6, No. 6, pp. 307-310 (Jun. 1985).
M. Myronov, et al., "Observation of two-dimensional hole gas with mobility and carrier density exceeding those of two-dimensional electron gas at room temperature in the SiGe heterostructures", Appl. Phys. Lett. 91, 082108 (2007).
P. Shiv Halasyamati, et al., "Noncentrosymmetric Oxides", Chem. Mater. 1998, 10, 2753-2769.
D. Paramanik, et al., "Formation of large-area GaN nanostructures with controlled geometry and morphology using top-down fabrication scheme", J. Vac. Sci. Technol. B 30, 052202 (2012).
T. Tamura, et al., "Nearly Temperature-Independent Saturation Drain Current in a Milti-Mesa-Channel AlGaN/GaN High Electron Mobility Transistor", Appl. Phys. Express 1 (2008) 023001.
J. Guo, et al., "Ultra-scaled AlN/GaN Enhancement- & Depletion-mode Nanoribbon HEMTs", ISDRS 2009, Dec. 9-11, 2009, College Park, MD, 978-1-4244-6031-1/09.
Berger, et al, "Ultrathin Epitaxial Graphite: 2D Electron Gas Properties and a Route toward Graphene-based Nanoelectronics", J. Phys. Chem. B 2004, 108, 19912-19916.
S.M. Sze, Semiconductor Devices, Physics and Technology, text book, 1995, pp. 108-109, 158-159, John Wiley & Sons, USA.
Babylon, an online technical dictionary, www.babylon.com/define/39/engineering-dictionary.html, defining the term "unipolar".
www.oxforddictionaries.com/us/define/american_english/unipolar, defining the term "unipolar".

* cited by examiner

SUPERLATTICE CRENELATED GATE FIELD EFFECT TRANSISTOR

BACKGROUND OF THE INVENTION

1. Technical Field

The present invention is directed to a heterostructure Field-Effect Transistor ("FET"). More particularly, the present invention is directed to a heterostructure FET having a superlattice structure with a plurality of Two-Dimensional Electron Gas (2DEG) channels, all of which are capable of being turned "off" by the application of a relatively low gate voltage. The present invention is equally applicable to superlattice structures having a plurality of Two-Dimensional Hole Gas (2DHG) channels. The present invention finds particular utility as a normally-on RF switch.

2. Background Information

A high-quality RF switch is ideally designed to minimize the on-resistance, $R_{on}$, while also minimizing the off-capacitance, $C_{off}$. An ideal RF switch, when "on", passes a signal without attenuation, distortion or insertion loss (all of which being a function of on-resistance) and, when "off", isolates the signal and prevents it from leaking through the switch (leakage being a function of the off-capacitance).

In order to be able to use an RF switch in as many applications as possible, it is desirable that the RF switch has a large bandwidth, which is proportional to the Figure of Merit for RF switches, the RF switch cut-off frequency. The formula for the RF switch cut-off frequency $F_{CO}$ is as follows:

$$F_{CO} = 1/(2\pi R_{on} C_{off}) \qquad \text{[Equation 1]}.$$

In conventional FET designs, any attempt to lower the on-resistance, such as by increasing the periphery of the device, generally causes the off-capacitance to increase proportionately. Given the inversely-proportional relationship between on-resistance and off-capacitance, it is difficult to improve (e.g., lower) insertion loss while not adversely impacting (e.g., lowering) the isolation simultaneously.

The prior art has attempted to reduce on-resistance by fabricating, in a laboratory setting, heterostructure FETs having a plurality of 2DEG channels. The term "heterostructure" (also, "hetero-junction") refers to a structure having two distinct layers of dissimilar material in intimate contact with each other. A superlattice structure is formed by manufacturing a plurality of periodically-repeated heterojunctions one on top of the other in a stacked relationship.

Certain heterostructure materials, such as Aluminum Gallium Nitride (AlGaN) and Gallium Nitride (GaN), create an electron well (i.e., a sheet of electrons) at the interface between the two dissimilar materials resulting from the piezoelectric effect and spontaneous polarization effect therebetween. The resulting sheet of electrons that forms at this interface is typically referred to as a Two-Dimensional Electron Gas ("2DEG") channel. FETs that operate by generating and controlling the electrons in the 2DEG channel are conventionally referred to as high electron mobility transistors ("HEMTs").

By stacking a plurality of these two-material heterostructures, and with the addition of appropriate doping in the layers to maintain the presence of the 2DEG channels when stacking a plurality of heterostructure layers, the electron sheets are able to act in parallel, allowing for greater current flow through the superlattice device.

When this type of FET is "on", the superlattice device has a lower on-resistance, relative to a single heterostructure-layer device, because the multiple 2DEG channels allow a proportionally higher current to flow between the source and drain, resulting in an overall reduction in on-resistance.

Coincidentally, the plurality of stacked heterostructure layers does not increase the off-capacitance proportional to the number of stacked layers. On-resistance is a two-dimensional measurement (i.e., between the source and drain), while off-capacitance is a three-dimensional measurement: off-state blocking voltages create three-dimensional fringing fields having a fringing-field capacitance and forming a significant portion of the off-state capacitance, which is a function of the spacing between the source and drain, as well as the volume and type of materials therebetween. Where the heterostructure layers are relatively thin, the volumetric material between source and drain is not proportionally increased. Thus, a thin-film, stacked heterostructure configuration decreases the on-resistance without proportionally impacting the off-capacitance, thereby allowing for a higher cut-off frequency and thus a larger bandwidth.

While the prior art has been able to fabricate, in a laboratory setting, stacked heterostructure FETs, the prior art devices exhibit excessively large leakage currents and are unable to be turned completely "off", even with the application of relatively high gate voltages, rendering such devices to be of limited utility. See, e.g., T. Palacios, et al., "Use of Double-Channel Heterostructures to Improve the Access Resistance and Linearity in GaN-Based HEMTs", IEEE Transactions on Electron Devices, Vol. 53, No. 3, pgs. 562-65 (March 2006) [Reference 1]; R. Chu, "AlGaN—GaN Double-Channel HEMTs", IEEE Transactions on Electron Devices, Vol. 52, No. 4, pgs. 438-46 (April 2005) [Reference 2]; S. Heikman, et al., "High conductivity modulation doped AlGaN/GaN multiple channel heterostructures", J. of Applied Physics, Vol. 94, No. 8, pgs. 5321-25 (Oct. 15, 2003) [Reference 3]; and N. H. Sheng, et al., "Multiple-Channel GaAs/AlGaAs High Electron Mobility Transistors", IEEE Electron Device Letters, Vol. EDL-6, No. 6, pgs. 307-10 (June 1985) [Reference 4], all of which are incorporated herein by reference.

SUMMARY OF THE INVENTION

While the device of the present invention is described with reference to a superlattice structure having a plurality of 2DEG channels, it is to be understood that the crenelated gate of the present invention is equally applicable to a superlattice structure having a plurality of two-dimensional hole gas (2DHG) channels. Accordingly, as used herein, the term "2DxG channel(s)" refers generically to 2DEG channel(s), as well as the analogous 2DHG channel(s).

In general, the present invention is directed to a field-effect transistor device comprising a superlattice structure having a plurality of 2DxG channels therewithin, a source, a drain and a crenelated gate capable of effectively controlling all 2DxG channels using conventional gate voltage levels, regardless of how many 2DxG channels are contained therewithin.

More specifically, the present invention is directed to a device comprising an epitaxial structure comprising a superlattice structure which has an uppermost 2DxG channel, a lowermost 2DxG channel and at least one intermediate 2DxG channel located between the uppermost and lowermost 2DxG channels, a source electrode operatively connected to each of the 2DxG channels, a drain electrode operatively connected to each of the 2DxG channels, a plurality of trenches located between the source electrode and the drain electrode. Each of the trenches having a length, a width and a depth defining a first sidewall surface, a second sidewall surface and a bottom surface located therebetween, the bottom surface of each of the trenches preferably being at or below the lowermost 2DxG channel. The device also comprises a crenelated gate electrode located over the uppermost 2DxG channel, the gate electrode being located within each of the trenches. The gate electrode has a top and a bottom surface, wherein the bottom surface of the gate electrode is in juxtaposition with the first sidewall surface, the bottom surface and the second sidewall surface of each of the trenches.

The superlattice structure preferably comprises a plurality of heterostructures, each of the heterostructures has a first layer and a second layer, located over the first layer, wherein each 2DxG channel within each heterostructure is located near the interface between the first and second layers.

A delta doping material is preferably located near the interface between the first layer and second layer within at least one of the heterostructures.

Each of the 2DxG channels is preferably bounded within a quadrilateral defined by the first length edge of the source electrode, the first length edge of the drain electrode, the back width edge of the drain electrode, the second length edge of the drain electrode, the second length edge of the source electrode, and the back width edge of the source electrode.

The device further preferably comprises a via located under the source electrode, the via having a width and a depth, the width of the via being less than or substantially equal to the width of the source electrode, and the depth of the via being at or below the lowermost 2DxG channel. A material is located within the via that has a dopant to allow low-resistance, ohmic contact between the source electrode and each of the 2DxG channels.

The angle between the bottom surface and the first sidewall surface of each trench is preferably less than about 110 degrees.

The length of each of the trenches can be less than, substantially equal to or greater than the distance between the front edge of the source electrode and the front edge of the drain electrode.

The device preferably further comprising a layer having a dielectric material, the layer being located on at least a portion of the superlattice structure.

DESCRIPTION OF THE PREFERRED EMBODIMENT(S)

While the device of the present invention is described with reference to a superlattice structure having a plurality of 2DEG channels, it is to be understood that the crenelated gate of the present invention is equally applicable to a superlattice structure having a plurality of two-dimensional hole gas (2DHG) channels. Accordingly, as used herein, the term "2DxG channel(s)" refers generically to 2DEG channel(s), as well as the analogous 2DHG channel(s).

The present invention is directed to a field-effect transistor comprising a superlattice structure having a plurality of 2DxG channels therewithin, a source, a drain and a crenelated gate capable of effectively controlling all 2DxG channels using conventional gate voltage levels, regardless of how many 2DxG channels are contained therewithin.

Figure 1:
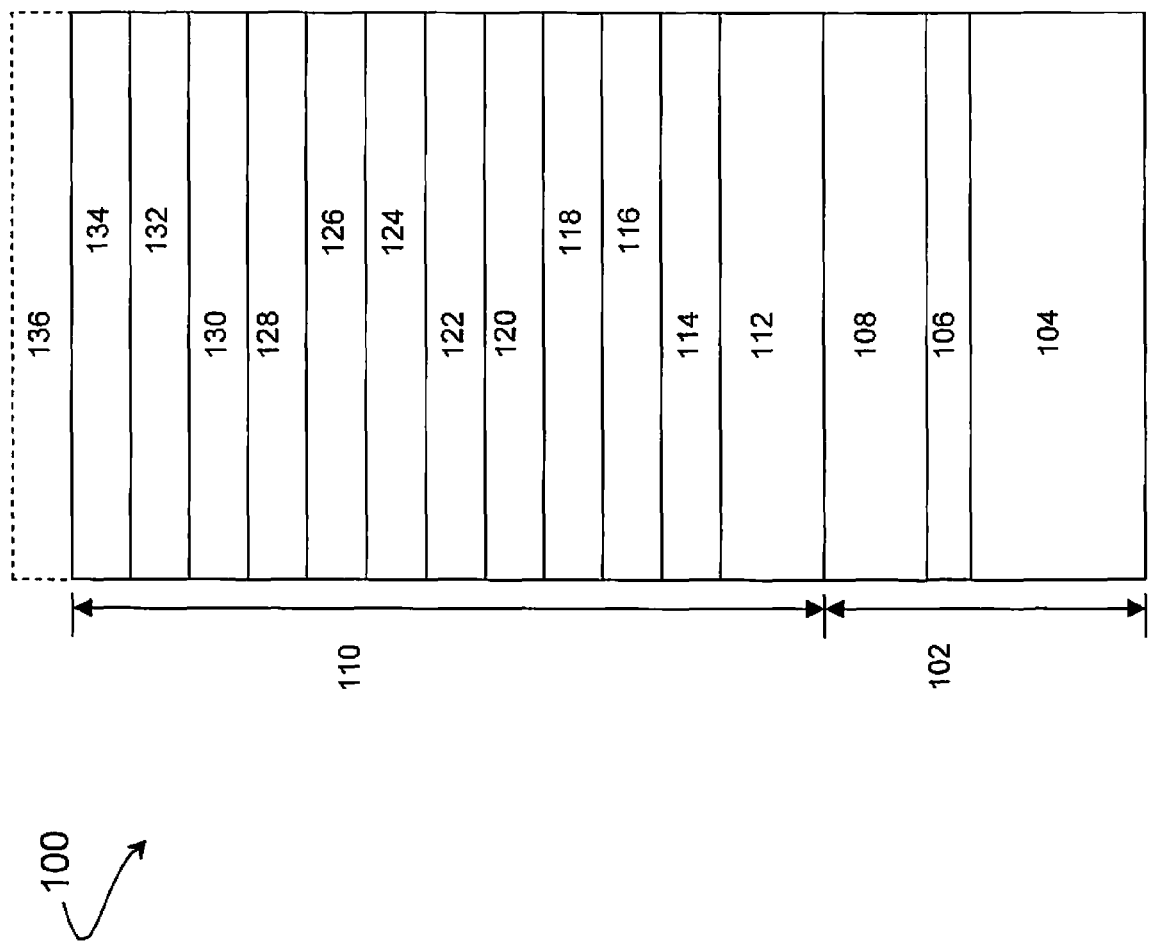
FIG. 1 is a side view of a preferred embodiment of the epitaxial structure of the present invention.

Turning now to FIG. 1, a side view of a preferred embodiment of the epitaxial structure of the present invention is illustrated. Epitaxial structure 100 preferably comprises base structure 102 and superlattice structure 110.

Base structure 102 allows the growth, deposit or other formation of superlattice structure 110 thereon and can be part of a homoepitaxial process (i.e., the base material is the same as the superlattice material) or heteroepitaxial process (i.e., the base material is different from the superlattice material, and employing a buffer), as will be appreciated by those skilled in the art.

As shown in FIG. 1, base structure preferably comprises substrate layer 104, nucleation layer 106 and buffer layer 108 of silicon carbide (SiC), aluminum nitride (AlN) and aluminum gallium nitride (AlGaN), respectively. Optionally, the base structure can comprise a substrate layer of sapphire, a nucleation layer comprising a combination of a low-temperature GaN layer and a high-temperature GaN layer, and a buffer layer based on the material of the superlattice structure to be located thereon, if required. The base structure can alternatively comprise a substrate layer of (111)—orientated crystalline silicon, a nucleation layer comprising AlN and a buffer layer comprising a series of discrete AlGaN layers (typically between two and eight layers), each discrete layer having a different aluminum composition. Other base structures will be apparent to those skilled in the art.

In the preferred embodiment, the percentage of aluminum in the AlGaN buffer layer is preferably in the range of between 0% and about 10%. It has been found that low AlGaN alloys allow this layer to act both as a buffer layer, as well as an effective back barrier layer to substantially minimize any current leakage from the superlattice structure into the base structure when the device is "on". Other materials and/or material compositions will be apparent to one skilled in the art.

Superlattice structure 110 comprises a plurality of heterostructures, each heterostructure preferably comprising two layers of dissimilar materials designed to create a sheet of electrons (i.e. a 2DEG channel) or a sheet of holes (i.e., a 2DHG channel) at the interface between the two dissimilar materials. Various heterostructure materials are known to produce 2DEG and 2DHG channels at the interface therebetween, including but not limited to Aluminum Gallium Nitride (AlGaN) and Gallium Nitride (GaN), Aluminum Gallium Arsenide (AlGaAs) and Gallium Arsenide (GaAs), Indium Aluminum Nitride (InAlN) and Gallium Nitride (GaN), alloys of Silicon (Si) and Germanium (Ge), and non-centrosymmetric oxides. See, e.g., M. Myronov, et al., "Observation of two-dimensional hole gas with mobility and carrier density exceeding those of two-dimensional electron gas at room temperature in the SiGe heterostructures", Appl. Phys. Lett. 91, 082108 (2007) [Reference 5]; and P. Shiv Halasyamati, et al., "Noncentrosymmetric Oxides", Chem. Mater. 1998, 10, 2753-2769 [Reference 6].

In the preferred embodiment, superlattice structure 110 comprises a plurality of heterostructures, between 2 and N, wherein N is defined as the maximum number of heterostructures that can be grown, deposited or otherwise formed on each other without cracking or other mechanical failure in the layers or 2DEG channels. As will be appreciated by one skilled in the art, the value of N is a function of the specific heterostructure materials and thickness of each layer.

Superlattice structure 110 is shown in FIG. 1 as having six heterostructures, to with, layers 112/114, 116/118, 120/122, 124/126, 128/130 and 132/134, comprising alternating layers of GaN (layers 112, 116, 120, 124, 128 and 132) and AlGaN (layers 114, 118, 122, 126, 130 and 134), each heterostructure forming a continuous 2DEG channel (not shown) at the interface within each heterostructure. The specific number of heterostructures within the superlattice structure and the heteromaterials can vary, and the relative positions of AlGaN and GaN may be reversed, as will be appreciated by one skilled in the art.

The percentage of aluminum in the AlGaN layers of the superlattice structure can range from about 0.1 to 100 percent. In the preferred embodiment, the percentage of aluminum in the AlGaN layers of the superlattice structure is preferably between about 20% and 100% aluminum-content aluminum gallium nitride ($Al_{0.2}Ga_{0.8}N$ and AlN, respectively). Specific compositions will be apparent to one skilled in the art.

The AlGaN deposited in layers 114, 118, 122, 126, 130 and 134 can be graded or non-graded. In the preferred embodiment, each AlGaN layer within the superlattice structure is graded, the term "graded" being used to denote the process of gradually changing the percentage of aluminum to its specified percentage, relative to the percentage of gallium, as known in the art.

While the dimensional thickness of layers 112-134 is not critical, the preferred thickness of GaN layer 112 is at least about 30 nanometers, the preferred thickness of GaN layers 116, 120, 124, 128 and 132 is between about 1 nanometer and about 50 nanometers, and the preferred thickness of AlGaN layers 114, 118, 122, 126, 130 and 134 is between about 1 nanometer and about 50 nanometers. Specific layer thicknesses are a function of the desired epitaxial characteristics, as will be apparent to one skilled in the art.

During the deposition, growth or other formation process of each of AlGaN layers 114, 118, 122, 126 and 130, a delta doping of an n-type dopant such as silicon (Si) is preferably added at the beginning of each of such AlGaN layers by introducing the dopant gas for a brief time interval, allowing the delta-doping for a confined thickness within the AlGaN layers to induce a 2DEG channel within each heterostructure. Similarly, a p-type dopant such as magnesium (Mg) would be introduced to induce a 2DHG channel in relevant heterostructures, as applicable. Other n-type and p-type dopants will be apparent to those skilled in the art.

In a single heterostructure, the dissimilar materials cause an imbalance stress in the system which allows polarization and/or piezoelectric effects to induce carriers to form in a potential well formed by the heterostructure, i.e., to create a 2DxG channel. In a superlattice structure where multiple heterostructures are stacked on top of each other, all heterostructures beneath the top heterostructure will become balanced and carriers that would otherwise induce in those potential wells will not be induced. Adding a doping layer near the interface where the potential well is formed will act to induce the carriers into that potential well, replacing the effect that would have occurred but for the balancing effect of multiple symmetric heterostructures. In the preferred embodiment, the delta-doping concentration is preferably between about $1E17$ $cm^{-3}$ and about $1E20$ $cm^{-3}$. Other delta-doping concentrations will be apparent to those skilled in the art.

Layer 136 can optionally be located on the top layer of the superlattice structure, either as a final passivation layer or as a dielectric for a MISFET (i.e., Metal Insulator Semiconductor Field Effect Transistor). In either case, layer 136 can comprise, for example, a nitride (e.g., SiN, $Si_3N_4$ and AlN) or an oxides (e.g., $SiO_2$, $ZrO_2$, $HfO_2$ and $TiO_2$), and is preferably silicon nitride ($Si_3N_4$ or $SiN_x$). While the dimensional thickness of the layer is not critical, its preferred thickness, when included, is between about 1 nanometer and about 200 nanometers, more preferably about 10 nanometers. Other layer materials and/or dimensions will be apparent to those skilled in the art.

While a preferred embodiment of the epitaxial structure of the present invention has been described with reference to FIG. 1, a field-effect transistor comprising a superlattice structure having a plurality of 2DEG channels has been heretofore difficult to control by using a planar gate between a source and drain. See, e.g., References 1 through 4.

Example 1

A normally-on field effect transistor was designed having a source, drain and gate deposited upon an epitaxy having a superlattice structure comprising six heterostructures, each heterostructure containing a 2DEG channel therewithin, each heterostructure formed by a layer of 40% graded AlGaN over a layer of GaN. The six AlGaN layers were each about 7.5 nanometers thick. The top five GaN layers were each about 8 nanometers thick, with the bottommost GaN layer being about 50 nanometers thick. A planar, Schottky gate was deposited thereon between source and drain. Various gate voltages were applied in an effort to determine the effective gate voltage required to turn "off" all 2DEG channels within the device. A gate voltage of −20V was shown to penetrate the superlattice structure to just below the second 2DEG channel, halting current flow through the top two 2DEG channels while allowing current to flow through the other four 2DEG channels therebelow. A gate voltage of −100V was shown to penetrate the upper four 2DEG channels, halting current flow therethrough but allowing current to flow unabated in the lowest two 2DEG channels. The experiment was thereafter discontinued based on the consensus that the application of a gate voltage in excess of −100V was commercially impractical.

Figure 2:
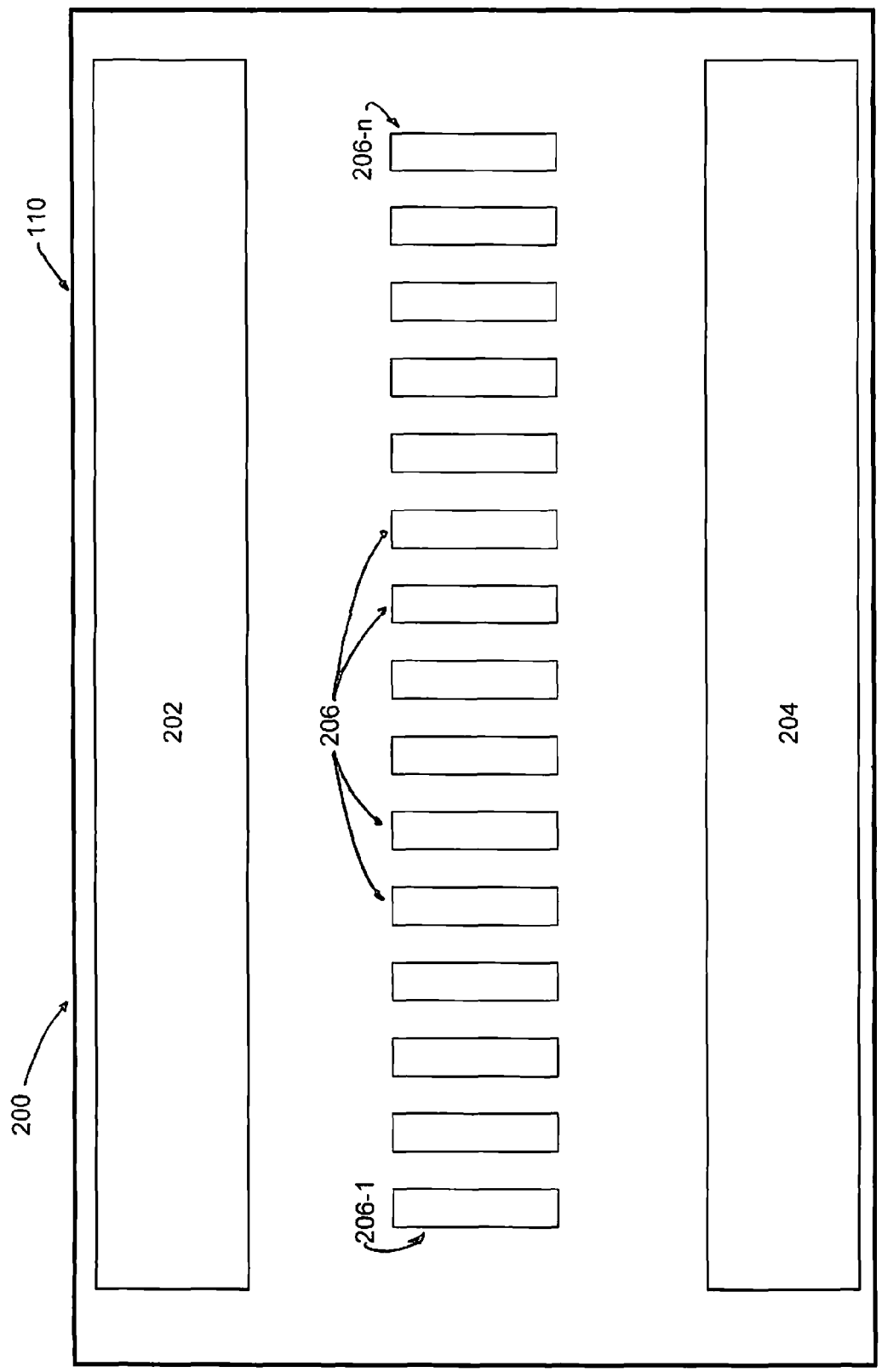
FIG. 2 is a top view of a preferred embodiment of a field effect transistor of the present invention, shown without a gate electrode thereon.

Turning now to FIG. 2, a top view of a preferred embodiment of a normally-on field effect transistor of the present invention is shown. Device 200 preferably comprises source electrode 202 and drain electrode 204 located on superlattice structure 110 shown and described with reference to FIG. 1, as well as a plurality of trenches 206 etched into the top of superlattice structure 110. Device 200 does not include optional layer 136 on superlattice structure 110.

Source electrode 202 and drain electrode 204 are preferably deposited on superlattice structure in conventional manner, each having ohmic contact with superlattice structure 110. For the AlGaN superlattice structure described with reference to FIG. 1, the source and drain electrodes are preferably conventional electrode materials comprising layers of titanium, aluminum and gold, as known in the art. Other source and drain electrode compositions will be apparent to those skilled in the art.

In the preferred embodiment, a gate electrode (not shown in FIG. 2; 402 in FIGS. 4; and 902 in FIG. 9) is deposited on superlattice structure 110 over trenches 206. For the AlGaN superlattice structure described with reference to FIG. 1, the gate electrode is preferably a conventional electrode material comprising layers of nickel and gold, as known in the art. Other gate electrode compositions will be apparent to those skilled in the art.

Figure 3:
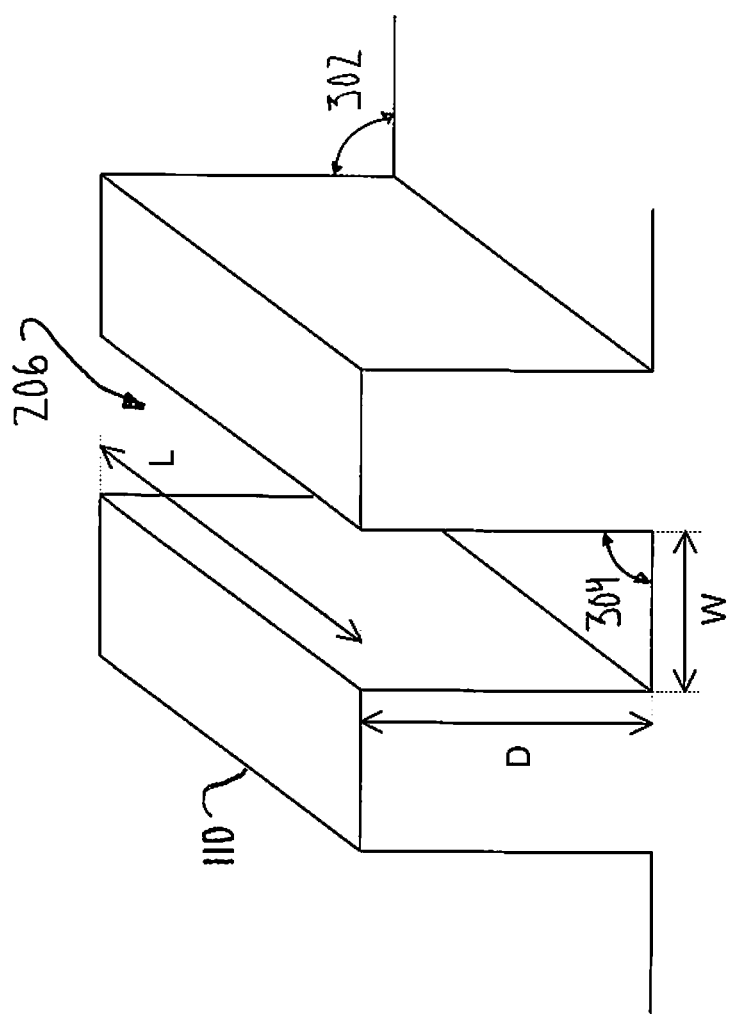
FIG. 3 is an orthogonal view of one of the channels shown in FIG. 2.

With reference to FIG. 3, an orthogonal view of one of the trenches is illustrated, showing trench dimensions length L, width W and depth D. The depth of each trench is preferably at, and more preferably below, the lowest 2DxG channel contained within superlattice structure 110. Given present-day manufacturing technology's imprecision to insure that the depth of each trench is precisely or substantially at the lowest 2DxG channel, it is most preferable that the depth of each trench is below the lowest 2DxG channel contained within superlattice structure 110. The length of each trench is variable, and can be as small as 0.01 microns or smaller, if tooling allows, and as large as the distance between source electrode 202 and drain electrode 204. The width of each trench is also variable, and can be 0.01 microns or smaller, if tooling allows.

Each trench is formed by removing a portion of superlattice structure 110 from device 200. While the superlattice structure can be formed with trenches 206 using masks, the trenches are preferably formed by an etching process. See, e.g., D. Paramanik, et al., "Formation of large-area GaN nanostructures with controlled geometry and morphology using top-down fabrication scheme", J. Vac. Sci. Technol. B 30, 052202 (2012) [Reference 7], incorporated herein by reference. Other methods of forming trenches 206 into the superlattice structure will be apparent to one skilled in the art.

The number of trenches, the length and width of each trench, as well as the spacing between each trench, are a function of the desired device characteristics and the heterostructure materials comprising the superlattice structure. The spacing between each trench (i.e., the unetched portion of superlattice structure 110) is also a function of the number of trenches to be etched, the width of each trench and the overall width of the device.

Specifying a given length and a given width for each trench is a trade-off between ease of manufacture and overall device characteristics, such as power handling capacity, insertion loss, isolation and threshold voltage to turn the device "off". For example, while trenches having a longer L and a wider W are easier to manufacture, and thus allow for a higher yield, such dimensional choices result in decreased current flow through the superlattice structure and increased device resistance (since there is less superlattice structure remaining) Conversely, a shorter L and a narrower W result in improved current flow and decreased device resistance (since there is more superlattice structure remaining) but may be harder to manufacture, resulting in decreased yields. Similarly, as the spacing between the trenches increases, the resistance of the device decreases (since there is more superlattice structure remaining) but the pinch-off voltage increases.

For the AlGaN/GaN superlattice structure described with reference to FIG. 1: length L of each trench is preferably between about 0.1 and about 1 microns; width W of each trench is preferably between about 0.04 and about 0.1 microns; the spacing between trenches is preferably between about 0.04 and about 0.1 microns; and the number of trenches is preferably between one, with the upper limit on the number of trenches being dependent on the width of the source and drain electrodes (or, alternatively, the width of the device) and the cumulative width of all trenches.

In the preferred embodiment, the dimensions of each trench, as well as the spacing therebetween, is the same for all trenches. Additionally, the trenches are preferably located between the leftmost edges of the source electrode and drain electrode on one end, and the rightmost edges of the source electrode and drain electrode on the other end, for reasons discussed below.

In an ideal manufacturing environment, angle 302, defined as the angle between one of the sidewalls and the bottom of the trench, and angle 304, defined as the angle between the other sidewall and the bottom of the trench, would be 90 degrees. Such an ideal environment is not currently available. During the trench etching process, the trench sidewalls are sloped in an obtuse manner, relative to the bottom of the trench. For the AlGaN/GaN superlattice structure described with reference to FIG. 1, angles 302 and 304 are preferably less than about 110 degrees, and more preferably about 96 to about 98 degrees.

Figure 4:
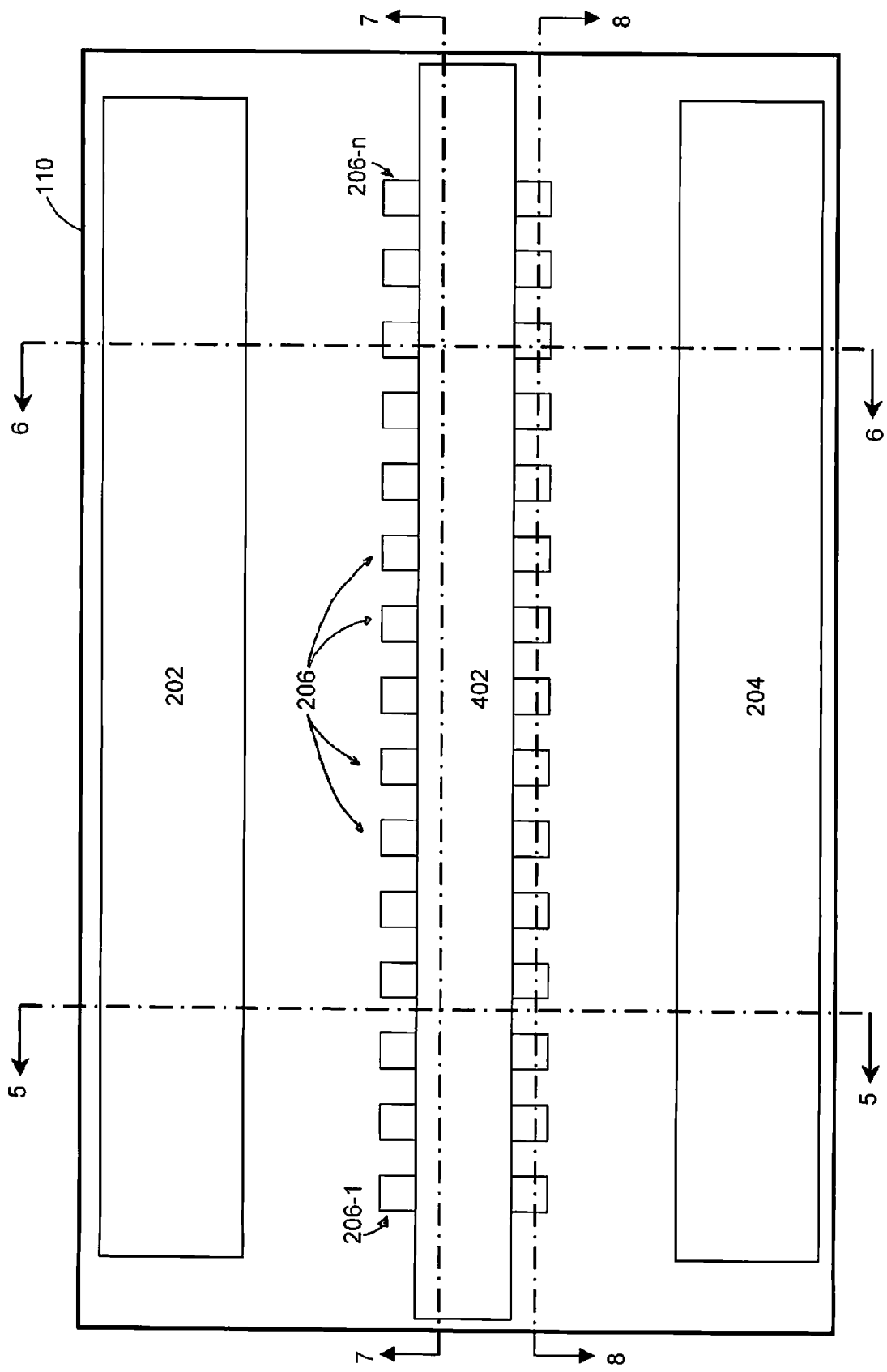
FIG. 4 is a top view of a first embodiment of the present invention.

Turning now to FIG. 4, a top view of a first embodiment of the present invention is shown, with gate electrode 402 located on superlattice structure 110 and trenches 206. The length of gate electrode 402 can be less than, equal to or greater than the length of trenches 206. [As will be appreciated by those skilled in the art, the "length" is conventionally defined as that dimension perpendicular to the source and drain electrodes. Similarly, the "width" is typically defined as that dimension parallel to the source and drain electrodes. This convention is followed herein.] As shown in FIG. 4, the length of the gate electrode is less than the length of the trenches. FIGS. 5, 6, 7 and 8 show a sectional view of FIG. 4 at lines 5-5, 6-6, 7-7 and 8-8, respectively.

With reference to FIGS. 5-8, the six 2DEG channels within superlattice structure 110 are shown as dotted lines therewithin, with source electrode 202 and drain electrode 204 located on the uppermost heterostructure of superlattice structure 110.

Figure 7:
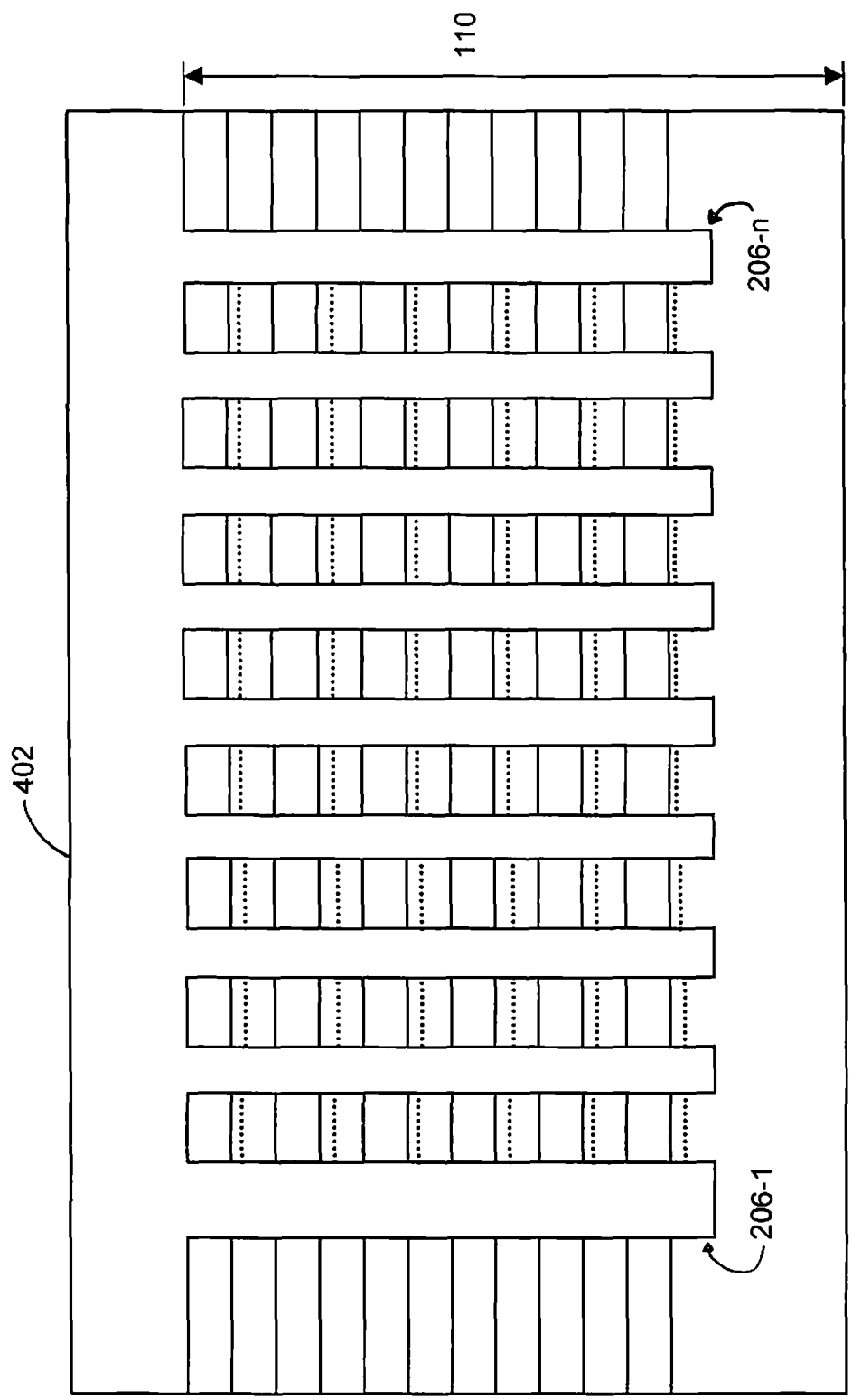
FIG. 7 is a sectional view of FIG. 4 taken at lines 7-7.
Figure 8:
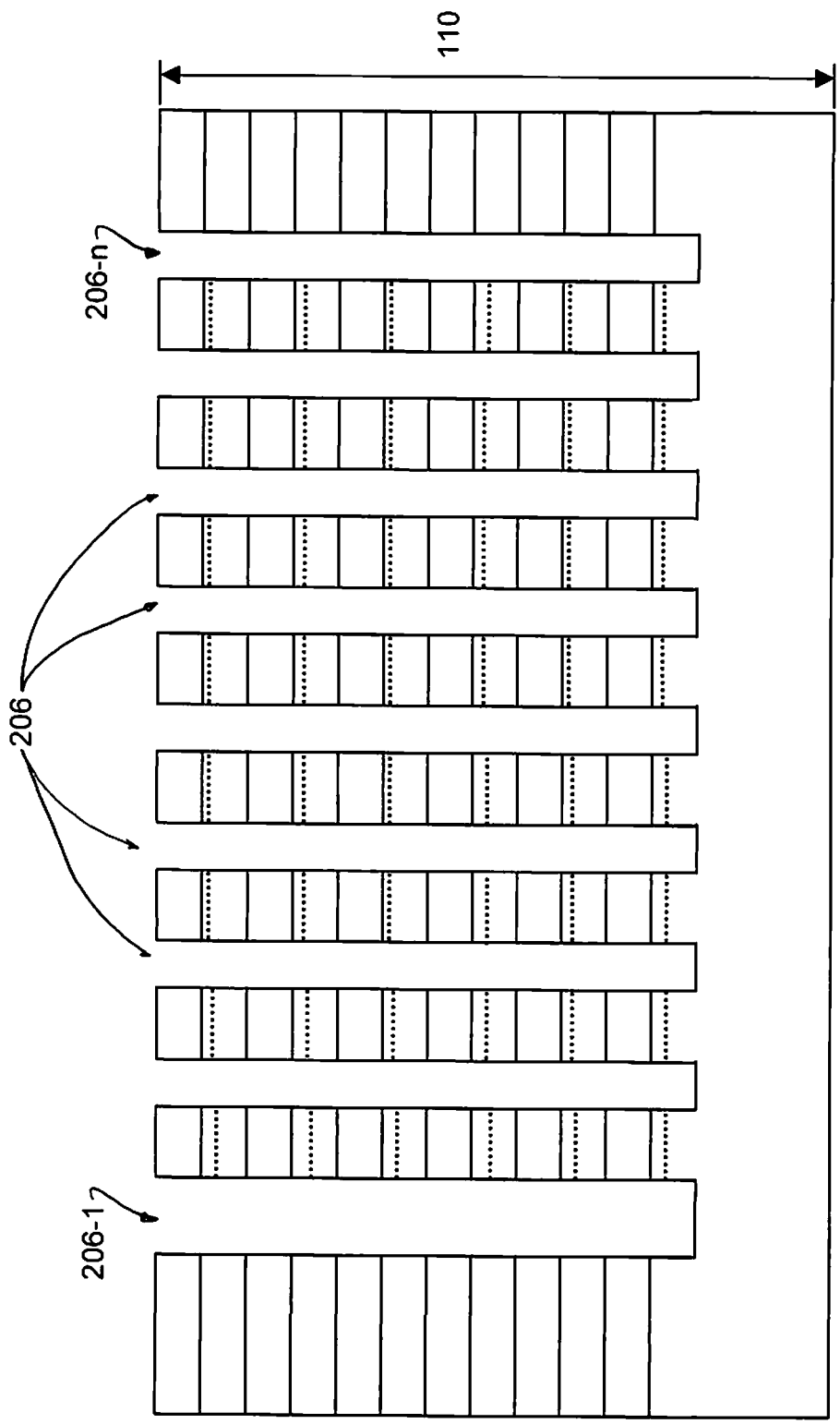
FIG. 8 is a sectional view of FIG. 4 taken at lines 8-8.

It is noted that the number of trenches shown in FIGS. 7 and 8 (i.e., 9 trenches) is less than the number of trenches shown in FIG. 4 (i.e., 15 trenches), which was done in an effort to simplify FIGS. 7 and 8. It is to be understood, however, that FIGS. 7 and 8 are to be interpreted as having the same number of trenches as shown in FIG. 4, despite not being depicted in their entirety. To that end, trench 206-1 and trench 206-$n$ shown in FIGS. 7-8 correspond to the leftmost trench and the rightmost trench, respectively, shown in FIG. 4.

In the preferred embodiment, via 502 and via 504 are located within superlattice structure 110 under source electrode 202 and drain electrode 204, respectively. Via 502 and via 504 are preferably included to provide low-resistance, ohmic contact between all 2DxG channels and source electrode 202 and drain electrode 204, respectively. The vias can be formed by any of the methods used to form trenches 206, as discussed above, and are preferably formed by etching into the superlattice structure, as discussed above.

The length, width and depth of the vias are variable. The length of via 502 and via 504 is preferably shorter than the length of the source and drain electrodes. The width of via 502 and via 504 is preferably substantially equal to the width of source electrode 202 and drain electrode 204, respectively. The depth of vias 502 and 504 is preferably below the lowermost 2DEG channel.

Vias 502 and 504 are filled with an $X^+$ regrowth material, the composition thereof being a function of the heteromaterials comprising the superlattice structure. For a superlattice structure having 2DEG channels, the vias are filled with an $N^+$ regrowth material, preferably GaN with highly-doped silicon therein. Similarly, for a superlattice structure having 2DHG channels, the vias are filled with a $P^+$ regrowth material, preferably GaN with highly-doped magnesium therein. In either case, the dopant concentration is preferably about 1E17 $cm^{-3}$ to about 1E20 $cm^{-3}$, more preferably about 5E19 $cm^{-3}$.

Figure 6:
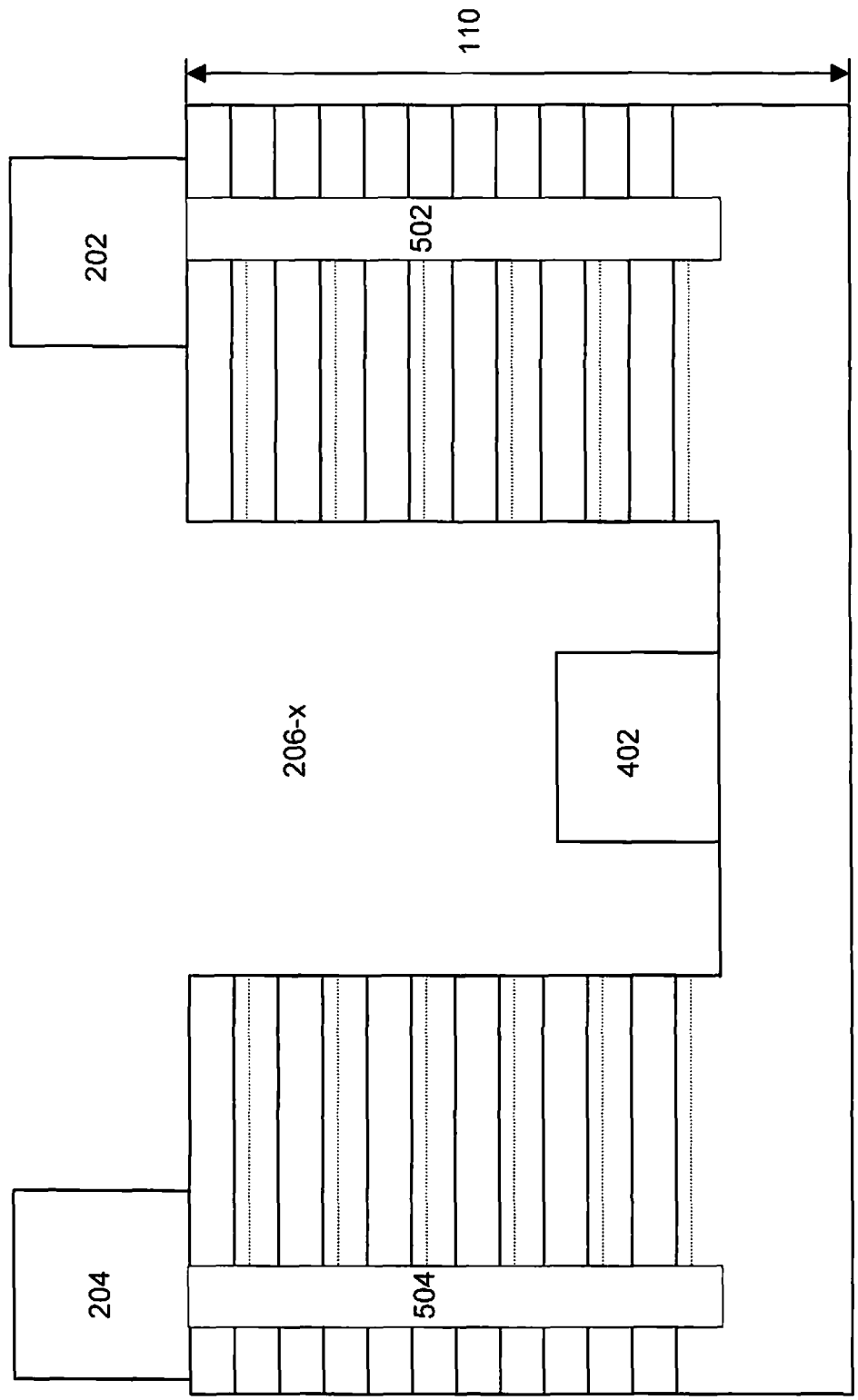
FIG. 6 is a sectional view of FIG. 4 taken at lines 6-6.

With reference to FIG. 6, the depth of trench 206-x is located below the lowermost 2DEG channel of the superlattice structure. This preferred depth of trench 206-x allows the bottom surface of gate electrode 402 to be positioned below the lowermost 2DEG channel of superlattice structure 110.

With reference to FIG. 7, gate electrode 402 is located within all trenches 206, while FIG. 8 shows a cross-sectional view of the trenches without the gate electrode therein.

Figure 5:
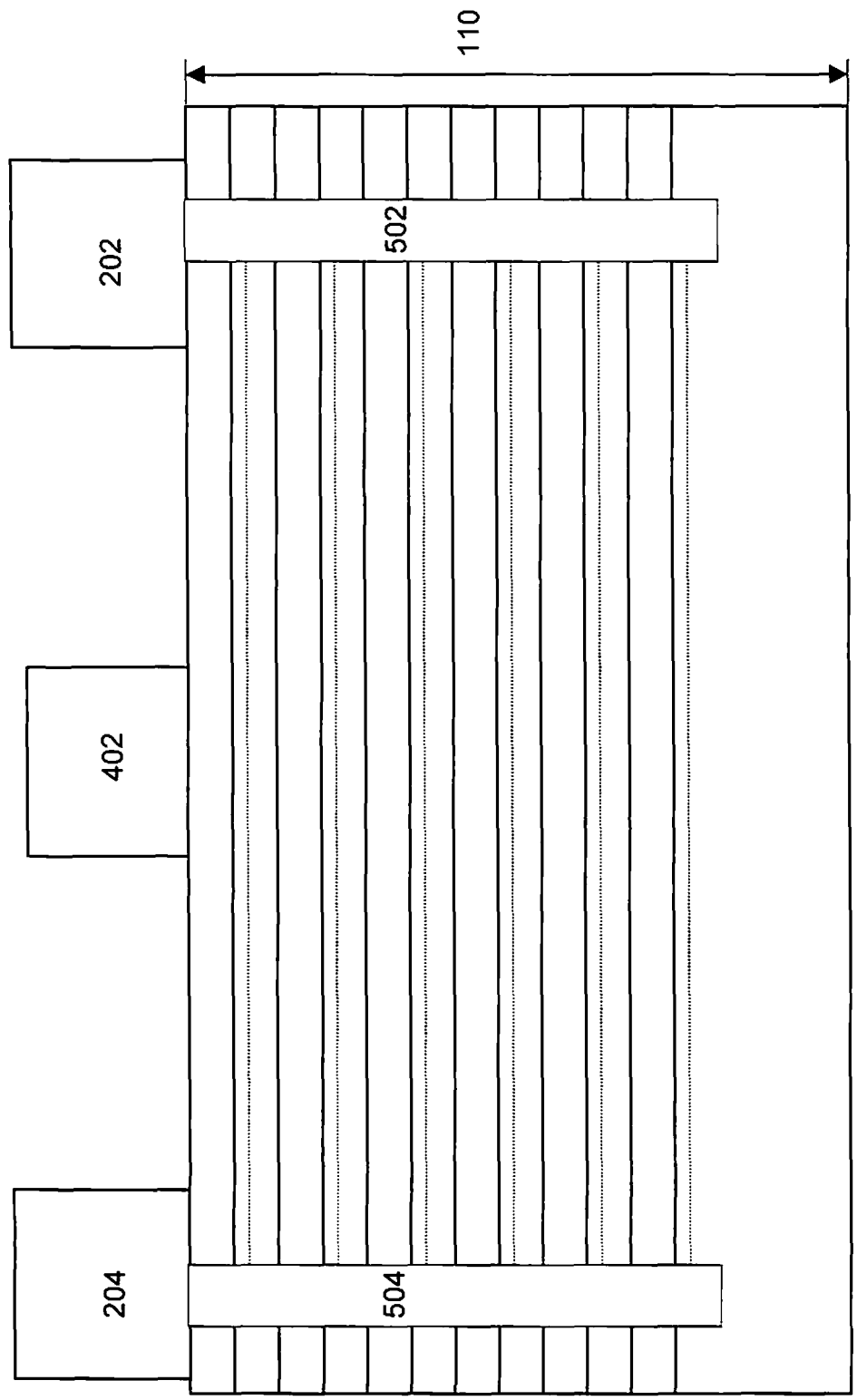
FIG. 5 is a sectional view of FIG. 4 taken at lines 5-5.

As shown in FIGS. 5 and 6, certain sections of the superlattice structure are preferably devoid of any operable 2DEG channels, specifically, the section between via 502 and the rightmost edge of the device, and the section between via 504 and the leftmost edge of the device. Similar sections are shown in FIGS. 7 and 8, specifically, the section between leftmost trench 206-1 and the leftmost edge of the device, and the section between rightmost trench 206-n and the rightmost edge of the device. The term "isolation regions" is defined herein as those sections of the superlattice structure specified hereinabove that are devoid of operable 2DEG channels.

Several methods are available to effectively eliminate and render non-operable those 2DEG channels contained in the isolation regions. For example, an ion-implantation technique can be used whereby helium atoms can be shot at a high velocity into the superlattice structure to disrupt its crystalline geometry, thereby eliminating the 2DEG channels within the targeted region. Alternatively, a mesa etch can be performed to achieve the same result. In the preferred embodiment, an ion-implantation technique is performed to create the isolation regions defined above.

With reference to FIGS. 4, 7 and 8, having a first and a second isolated implanted region on the left and right sides of the device (i.e., the section between leftmost trench 206-1 and the leftmost edge of the device, and the section between rightmost trench 206-n and the rightmost edge of the device, respectively) eliminates the possibility that current will flow between the leftmost portions of the source and drain electrodes on one side, and between the rightmost portions of the source and drain electrodes on the other side, which would effectively bypass the trench area.

Similarly, with reference to FIGS. 4, 5 and 6, having a third and a fourth isolated implanted region in the section between via 502 and the rightmost edge of the device, and the section between via 504 and the leftmost edge of the device, respectively, eliminates the possibility that current will flow around the device when multiple devices are manufactured in close proximity to each other on the same base structure. While these third and fourth isolated implanted regions may not be as critical as the first two isolated implanted regions, the preferred embodiment contains all four isolated implanted regions to cover all scenarios.

Given a superlattice structure having a source electrode, a drain electrode, a plurality of trenches, a crenelated gate electrode located within each of the trenches and all four isolated implanted regions, each as discussed above, the crenelated gate electrode of the present invention is able to pinch off all current flowing between the source electrode and the drain electrode by application of conventional gate voltages.

Example 2

A normally-on field effect transistor was designed as described with reference to Example 1, and further comprising about 1000 trenches, each trench having a length of 0.6 microns, a width of 0.05 microns and a depth below all six 2DEG channels, wherein the trenches were spaced 0.08 microns apart from each other. The angle of the trench sidewalls (i.e., angle 302 and angle 304) was about 96 degrees. A gate electrode having a length of about 0.25 microns and a width of about 67 microns was deposited onto the superlattice structure and within each of the trenches such that the bottom portion of the gate electrode was also below all six 2DEG channels. The device had the following characteristics: drain current of 2.68 A/mm at 5 $V_d$; $R_{on}$ was 0.49 ohms·mm; and $C_{off}$ was 0.2 pF/mm. Various gate voltages were applied in an effort to determine the effective gate voltage [$V_g$] required to turn "off" all 2DEG channels within the device. Several devices were manufactured over time, and each experiment resulted in all six 2DEG channels being turned "off", with no current leakage, upon the application of a gate voltage of between about −8V and about −14 V.

Figure 9:
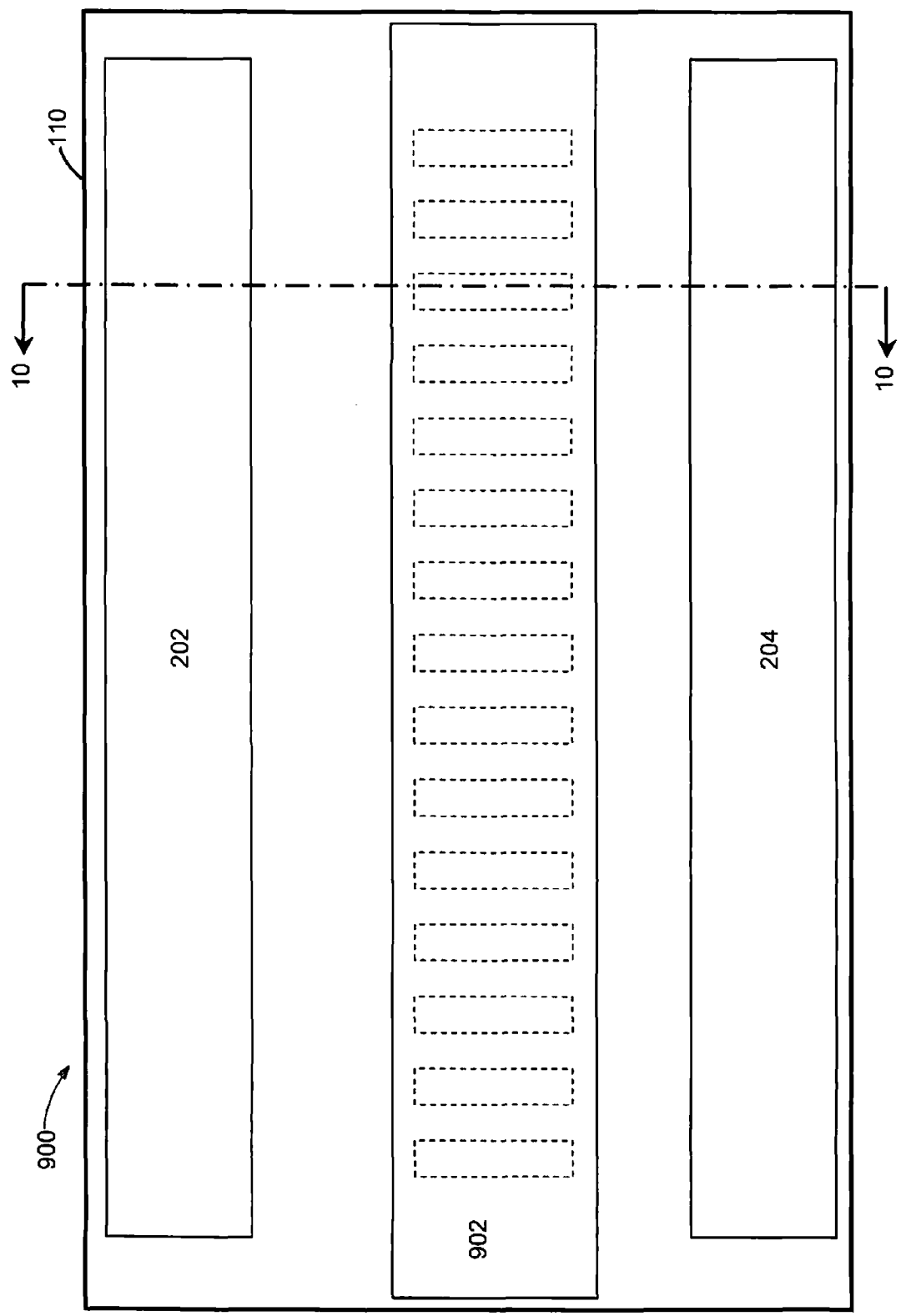
FIG. 9 is a top view of a second embodiment of the present invention.
Figure 10:
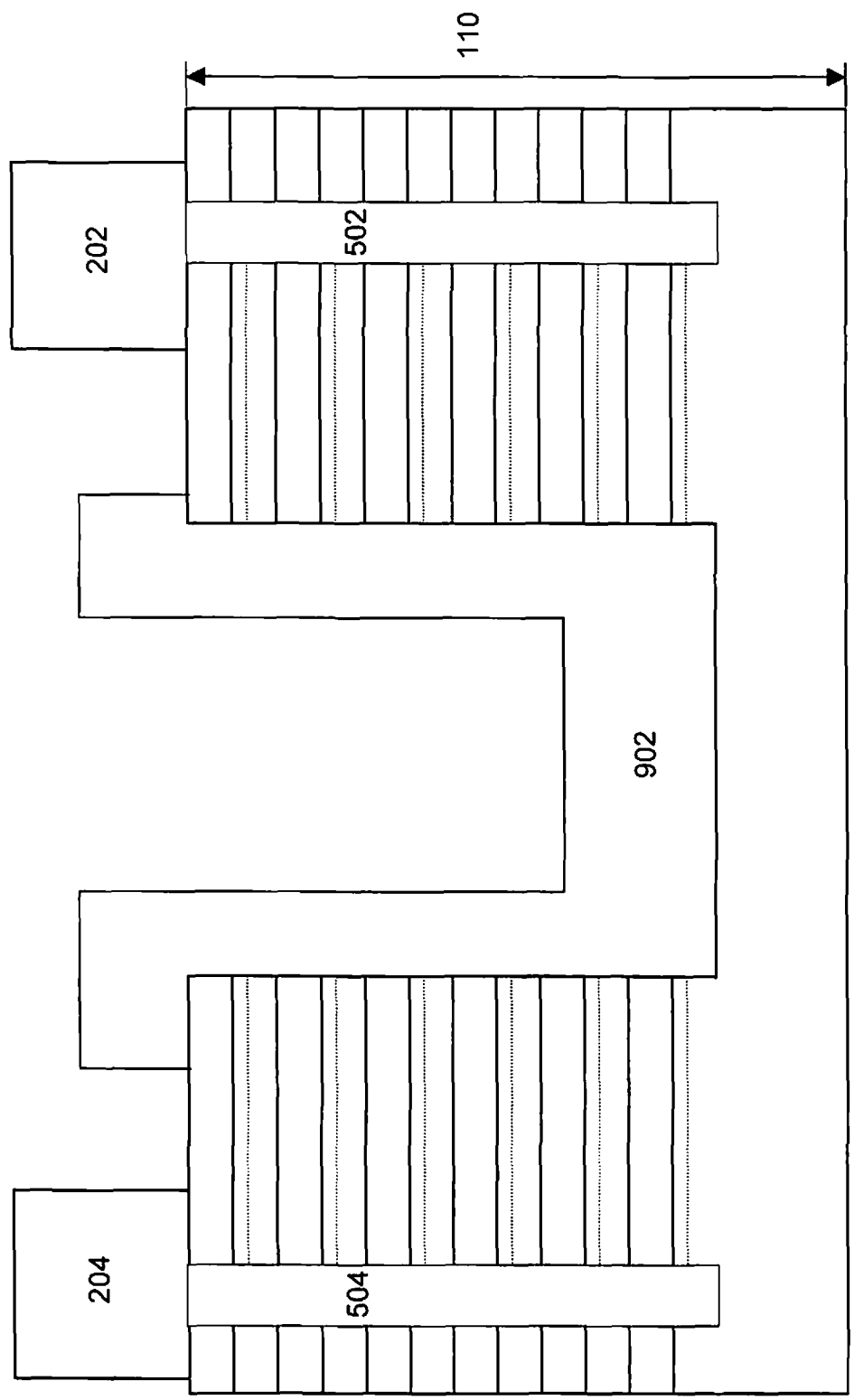
FIG. 10 is a sectional view of FIG. 9 taken at lines 10-10.
Figure 11:
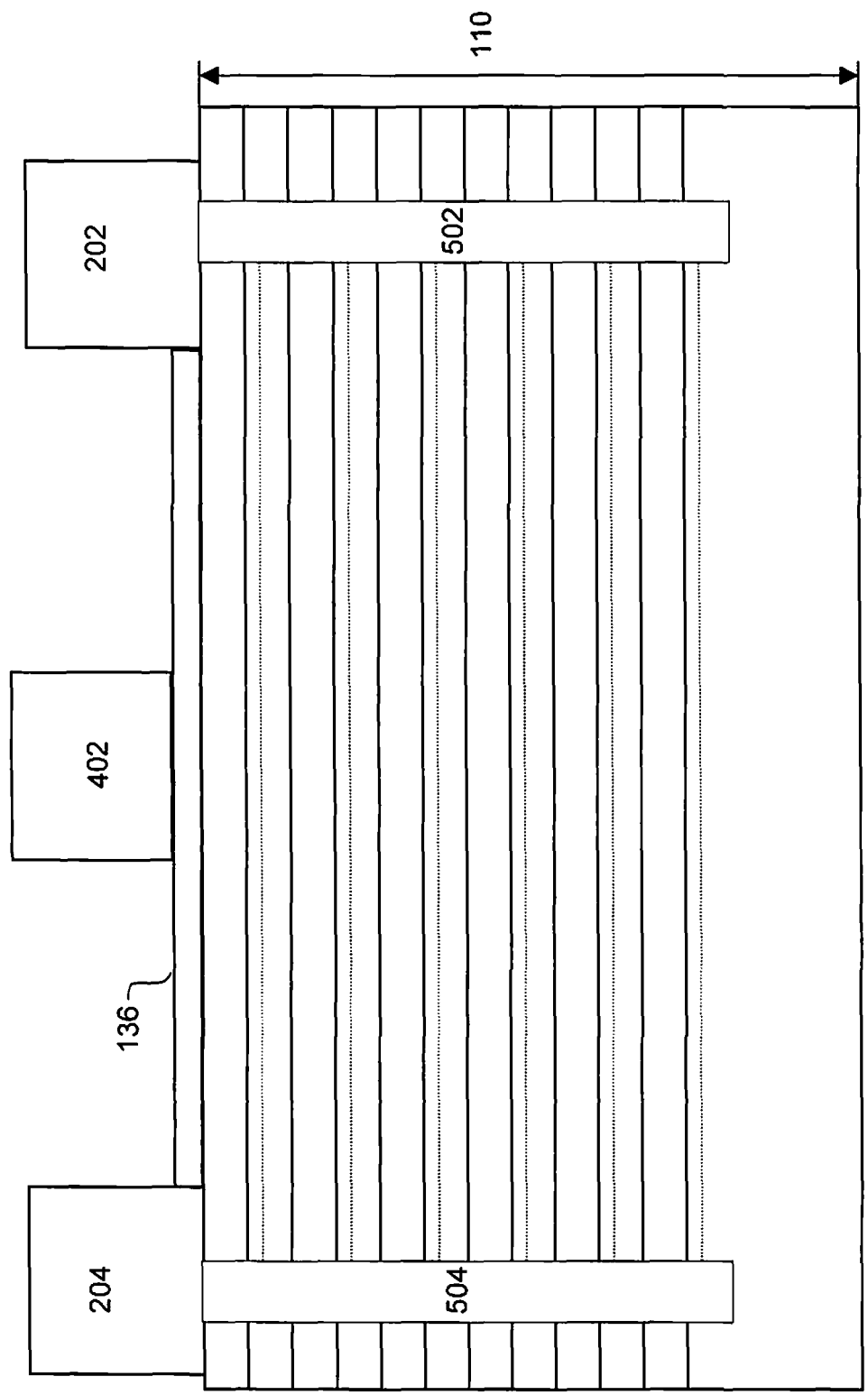
FIGS. 11 through 14 show various sectional views of a third embodiment of the present invention.
Figure 12:
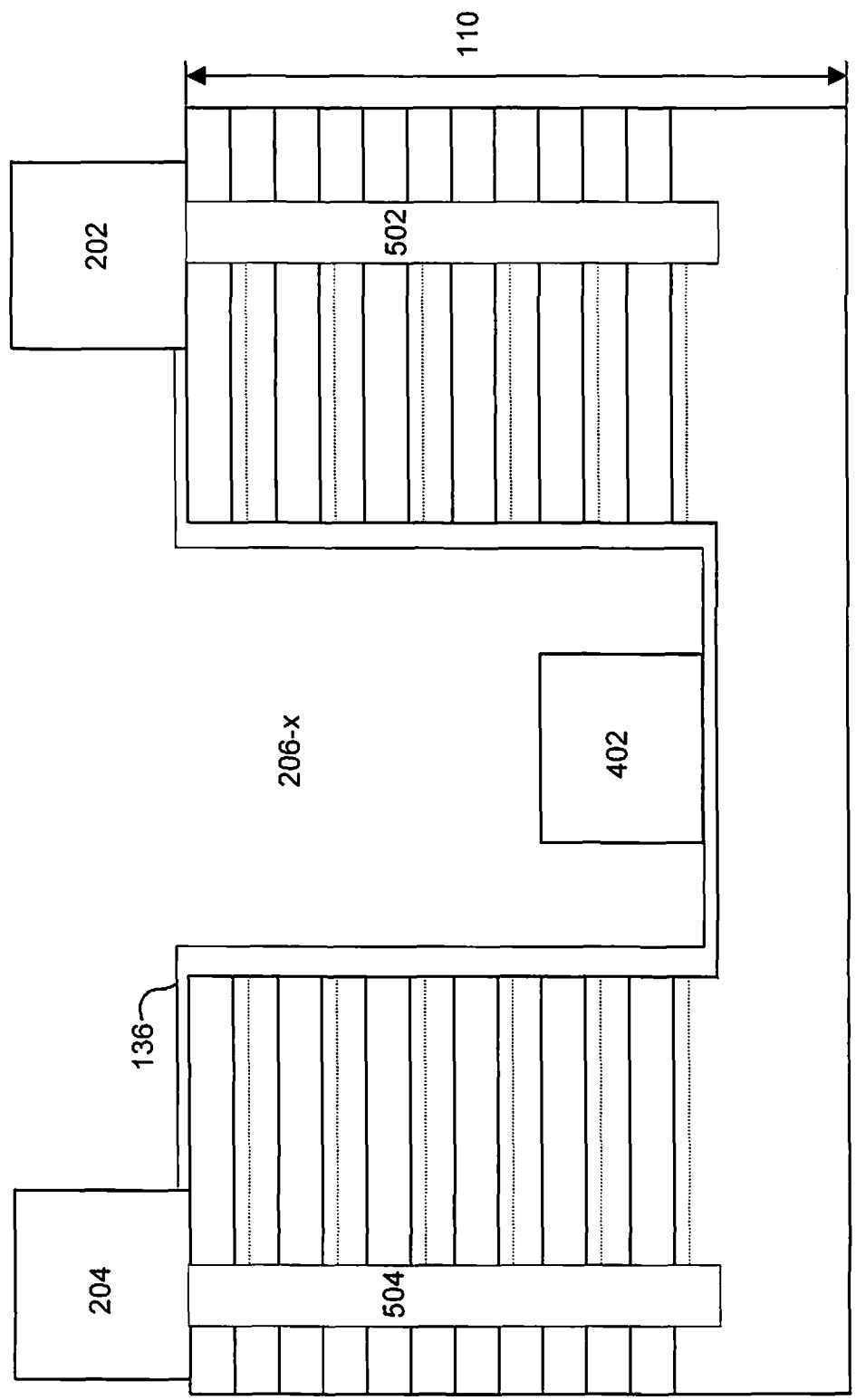
Figure 13:
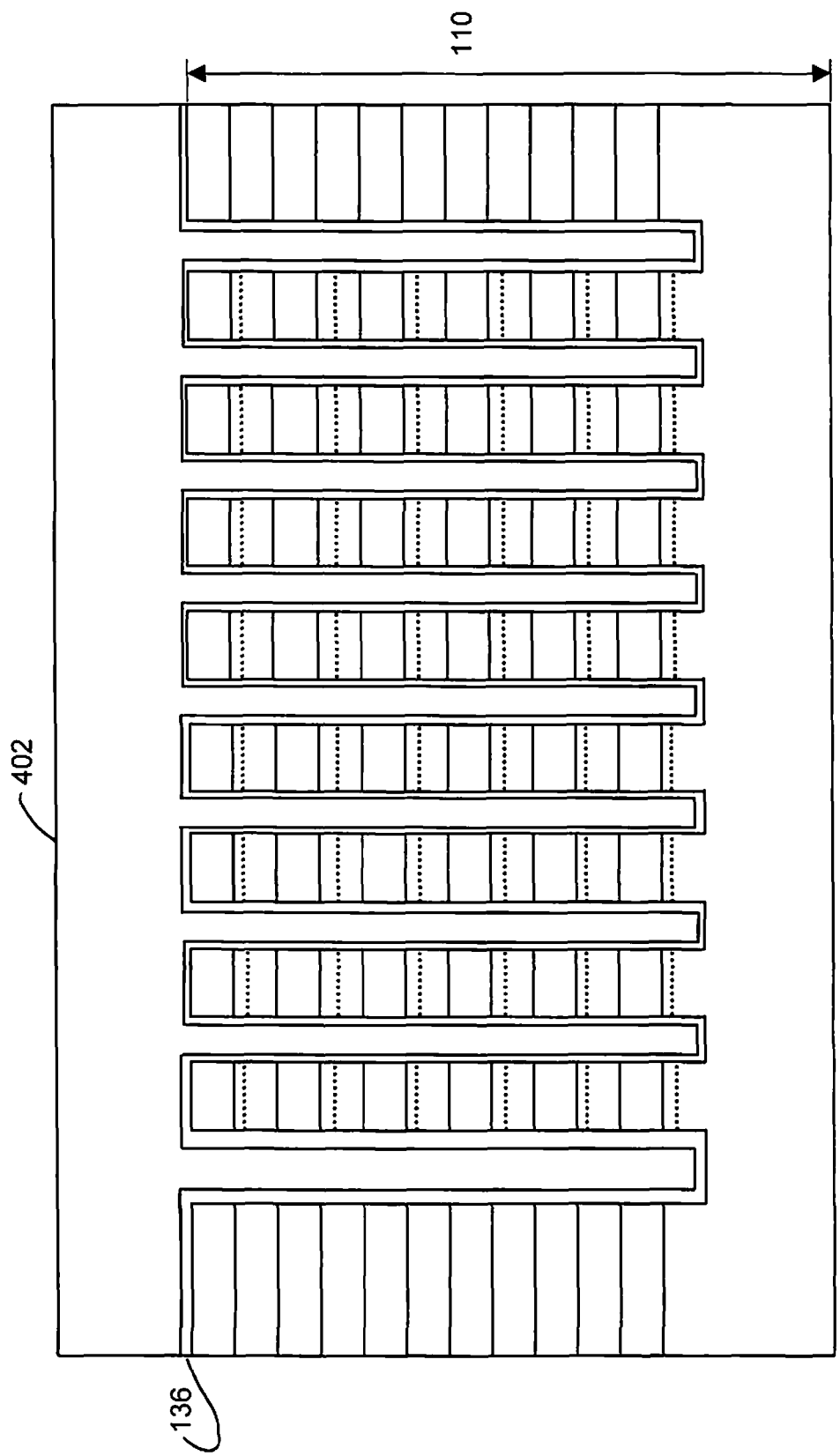
Figure 14:
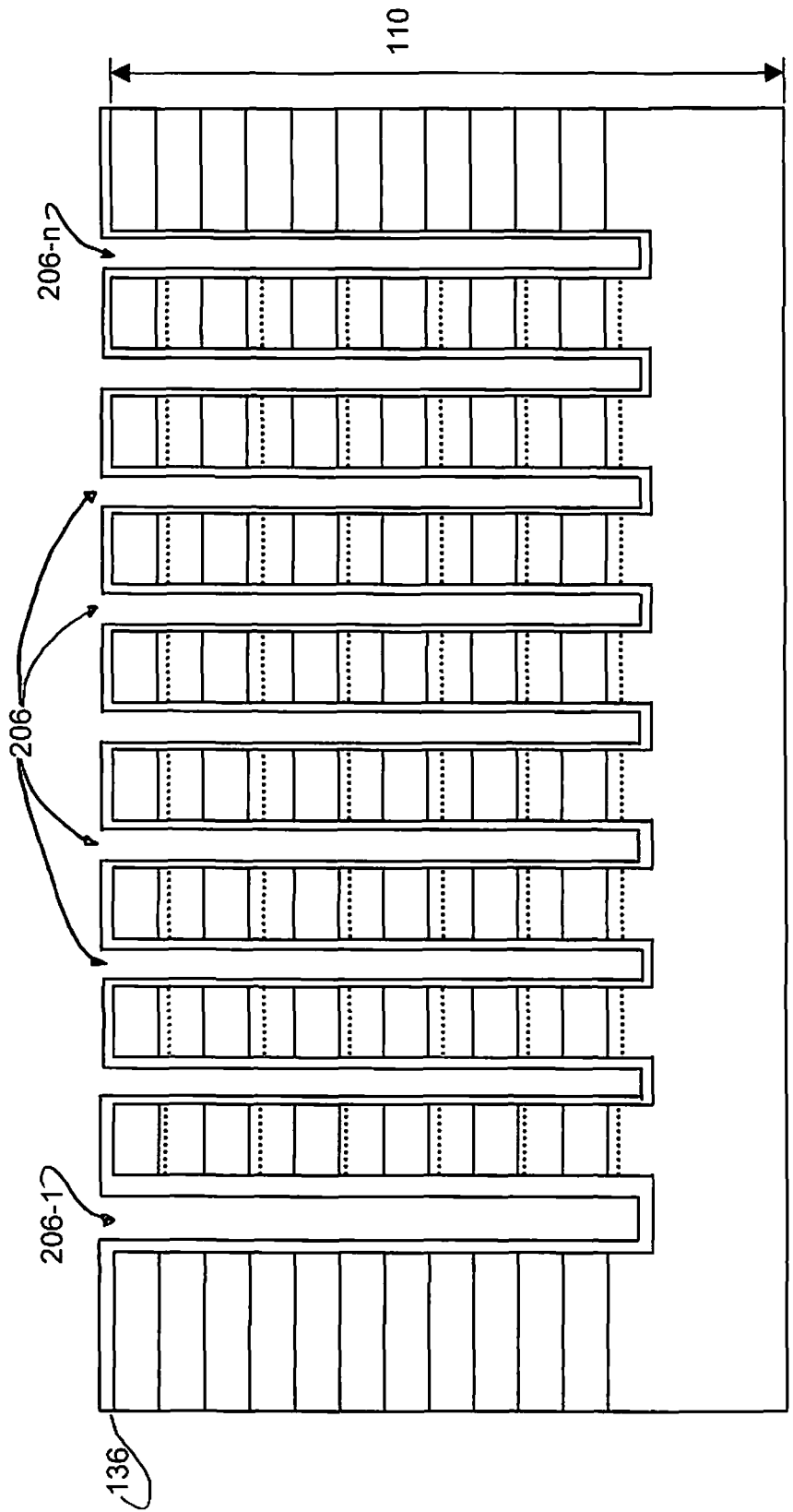

Turning now to FIG. 9, a top view of a second embodiment of the present invention is illustrated. Device 900 is substantially as described with reference to device 200 and FIGS. 2-8 above, with the exception of the length of gate electrode 902, which is greater than the length of the trenches located thereebeneath (shown in FIG. 9 as dotted lines for clarity purposes only). FIG. 10 shows a sectional view of FIG. 9 taken at sectional lines 9-9.

As will be appreciated by those skilled in the art, the shorter the length of the trenches, the lower the device resistance. The lower the device resistance, the better the device performance. For example, a lower device resistance translates into a lower insertion loss (for RF switch applications) and higher current throughput and more power (for amplifier applications).

One way to minimize the resistance of device 200 (FIG. 2) and/or device 900 (FIG. 9) is to minimize the length of trenches 206 (FIG. 2). The shorter this length, the relatively more expensive it may be to manufacture the gate electrode that fits within the trenches using current lithograph tools or e-beam technology. By manufacturing a gate electrode whose length is greater than the length of the trenches, one is able to use the relatively less expensive manufacturing techniques to manufacture the gate electrode.

As discussed above, neither device 200 nor device 900 includes optional layer 136 (FIG. 1) on superlattice structure 110.

In a third embodiment of the present invention, device 200 includes layer 136 as a dielectric layer for a MISFET application, and is preferably located on the topmost heterostructure layer of superlattice structure 110 between the source electrode and the drain electrode. FIGS. 11 through 14 illustrate the location of layer 136 on device 200, and parallel FIGS. 5 through 8, respectively.

Figure 15:
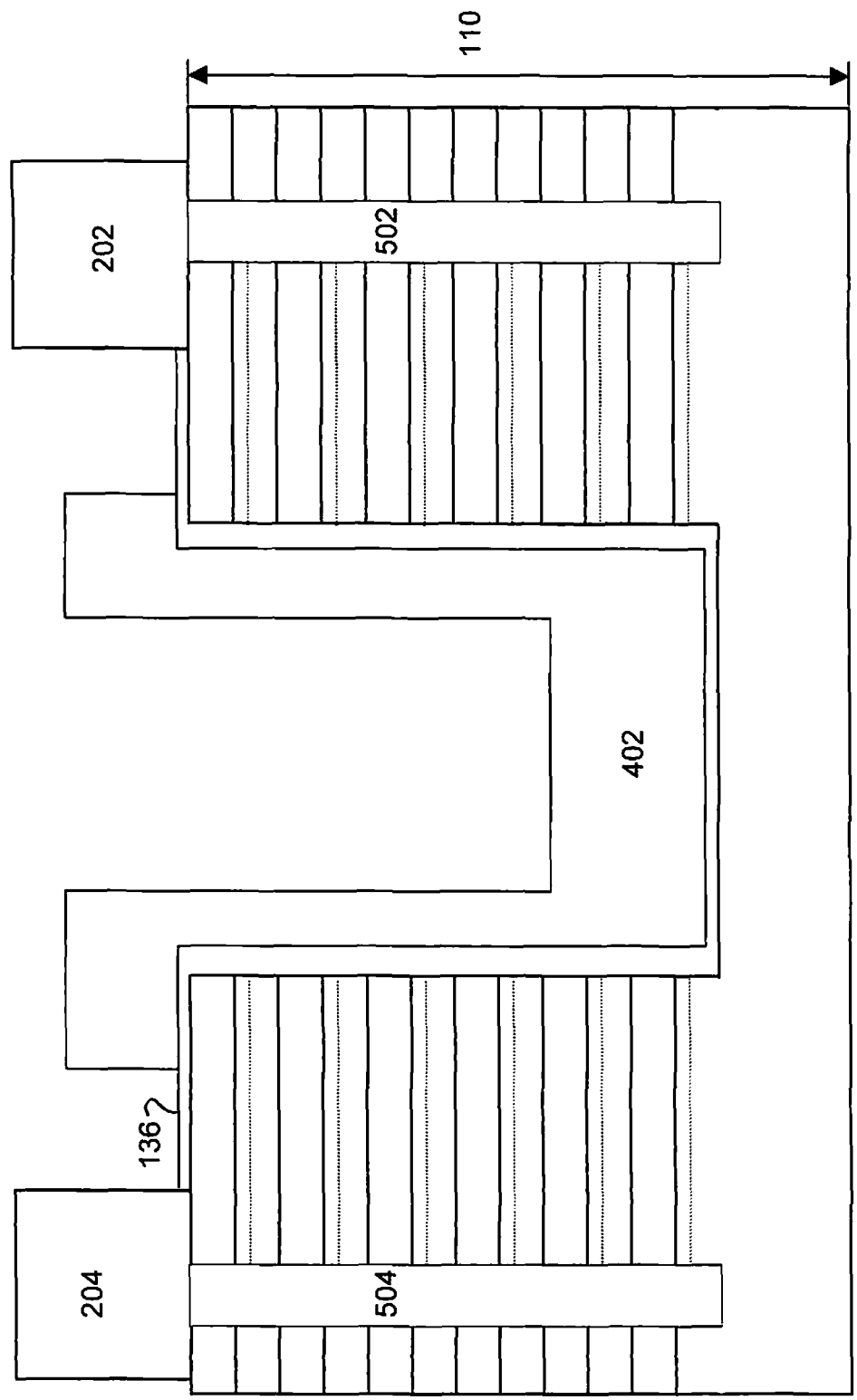
FIG. 15 is a sectional view of a fourth embodiment of the present invention.

In a fourth embodiment of the present invention, device 900 includes layer 136 as a dielectric layer for a MISFET application, and is preferably located on the topmost heterostructure layer of superlattice structure 110 between the source electrode and the drain electrode. FIG. 15 illustrates the location of layer 136 on device 900, and parallels FIG. 10.

Although illustrative embodiments of the present invention have been described in detail with reference to the accompanying drawings, it is to be understood that the invention is not limited to those precise embodiments. Various changes or modifications may be effected therein by one skilled in the art without departing from the scope or spirit of the invention.

What we claim as our invention is:
1. A field effect transistor device comprising:
    a base structure;
    a first heterostructure having a first layer located over said base structure, a second layer located over said first layer, and a first 2DxG channel located near the interface between said first and said second layers;

a first delta doping material located in the second layer near the interface between the first layer and second layer;

a second heterostructure having a third layer located in direct contact with said second layer, a fourth layer located over said third layer, and a second 2DxG channel located near the interface between said third and said fourth layers;

a second delta doping material located in the fourth layer near the interface between the third layer and fourth layer;

a third heterostructure having a fifth layer located over said fourth layer, a sixth layer located over said fifth layer, and a third 2DxG channel located near the interface between said fifth and said sixth layers;

a source electrode located over said sixth layer and ohmically connected to each of said 2DxG channels;

a drain electrode located over said sixth layer and ohmically connected to each of said 2DxG channels;

a plurality of trenches located between said source electrode and said drain electrode, each of said trenches having a length, a width and a depth defining a first sidewall surface, a second sidewall surface and a bottom surface located therebetween, the bottom surface of each of said trenches being at or below the first 2DxG channel;

wherein all of said 2DxG channels are either 2DEG channels or 2DHG channels, thereby creating a unipolar device; and a crenelated gate electrode located over said sixth layer, said gate electrode located within each of said trenches, said gate electrode having a top and a bottom surface, the bottom surface of said gate electrode being in juxtaposition with the first sidewall surface, the bottom surface and the second sidewall surface of each of said trenches.

2. The field effect transistor device of claim 1, wherein:
said source electrode has a first length edge, a second length edge, a front width edge and a back width edge;
said drain electrode has a first length edge, a second length edge, a front width edge and a back width edge; and
each of said 2DxG channels are bounded within a quadrilateral defined by the first length edge of said source electrode, the first length edge of said drain electrode, the back width edge of said drain electrode, the second length edge of said drain electrode, the second length edge of said source electrode, and the back width edge of said source electrode.

3. The field effect transistor device of claim 1, wherein said source electrode has a width and a length, said device further comprising:
a via located under said source electrode, said via having a width and a depth, the width of said via being less than or substantially equal to the width of said source electrode, and the depth of said via being at or below said first 2DxG channel; and
a material located within said via, the material having a dopant to allow low-resistance, ohmic contact between said source electrode and each of said 2DxG channels.

4. The field effect transistor device of claim 1, wherein said drain electrode has a width and a length, said device further comprising:
a via located under said drain electrode, said via having a width and a depth, the width of said via being less than or substantially equal to the width of said drain electrode, and the depth of said via being at or below said first 2DxG channel; and a material located within said via, the material having a dopant to allow low-resistance, ohmic contact between said drain electrode and each of said 2DxG channels.

5. The field effect transistor device of claim 1, wherein, within each of said trenches, the angle between the bottom surface and the first sidewall surface is less than about 110 degrees.

6. The field effect transistor device of claim 1, wherein:
said source electrode has a first length edge, a second length edge, a front width edge and a back width edge;
said drain electrode has a first length edge, a second length edge, a front width edge and a back width edge; and
the length of each of said trenches is less than or substantially equal to the distance between the front edge of said source electrode and the front edge of said drain electrode.

7. The field effect transistor device of claim 1, wherein said crenelated gate electrode has a width and a length, and wherein the length of said crenelated gate electrode is less than or substantially equal to the length of each of said trenches.

8. The field effect transistor device of claim 1, wherein said crenelated gate electrode has a width and a length, and wherein the length of said crenelated gate electrode is greater than the length of each of said trenches.

9. The field effect transistor device of claim 1, said device further comprising a seventh layer having a dielectric material, said seventh layer located on at least a portion of said sixth layer.

10. A device comprising:
an epitaxial structure comprising a superlattice structure having an uppermost 2DxG channel, a lowermost 2DxG channel induced by the presence of a first delta doping layer, and at least one intermediate 2DxG channel induced by the presence of a second delta doping layer located between said uppermost and said lowermost 2DxG channels;

a source electrode located over said uppermost 2DxG channel and ohmically connected to each of said 2DxG channels;

a drain electrode located over said uppermost 2DxG channel and ohmically connected to each of said 2DxG channels;

a plurality of trenches located between said source electrode and said drain electrode, each of said trenches having a length, a width and a depth defining a first sidewall surface, a second sidewall surface and a bottom surface located therebetween, the bottom surface of each of said trenches being at or below the lowermost 2DxG channel;

wherein all of said 2DxG channels are either 2DEG channels or 2DHG channels, thereby creating a unipolar device; and a crenelated gate electrode located over said uppermost 2DxG channel, said gate electrode located within each of said trenches, said gate electrode having a top and a bottom surface, the bottom surface of said gate electrode being in juxtaposition with the first sidewall surface, the bottom surface and the second sidewall surface of each of said trenches.

11. The device of claim 10, wherein said superlattice structure comprises a plurality of heterostructures, each of said heterostructures having a first layer, and a second layer located over said first layer, wherein one of said 2DxG channels is located near the interface between said first layer and said second layer.

12. The device of claim 10, wherein:

said source electrode has a first length edge, a second length edge, a front width edge and a back width edge;

said drain electrode has a first length edge, a second length edge, a front width edge and a back width edge; and each of said 2DxG channels are bounded within a quadrilateral defined by the first length edge of said source electrode, the first length edge of said drain electrode, the back width edge of said drain electrode, the second length edge of said drain electrode, the second length edge of said source electrode, and the back width edge of said source electrode.

13. The device of claim 10, wherein said source electrode has a width and a length, said device further comprising:

a via located under said source electrode, said via having a width and a depth, the width of said via being less than or substantially equal to the width of said source electrode, and the depth of said via being at or below said lowermost 2DxG channel; and a material located within said via, the material having a dopant to allow low-resistance, ohmic contact between said source electrode and each of said 2DxG channels.

14. The device of claim 10, wherein said drain electrode has a width and a length, said device further comprising:

a via located under said drain electrode, said via having a width and a depth, the width of said via being less than or substantially equal to the width of said drain electrode, and the depth of said via being at or below said lowermost 2DxG channel; and a material located within said via, the material having a dopant to allow low-resistance, ohmic contact between said drain electrode and each of said 2DxG channels.

15. The device of claim 10, wherein, within each of said trenches, the angle between the bottom surface and the first sidewall surface is less than about 110 degrees.

16. The device of claim 10, wherein:

said source electrode has a first length edge, a second length edge, a front width edge and a back width edge;

said drain electrode has a first length edge, a second length edge, a front width edge and a back width edge; and the length of each of said trenches is less than or substantially equal to the distance between the front edge of said source electrode and the front edge of said drain electrode.

17. The device of claim 10, wherein said crenelated gate electrode has a width and a length, and wherein the length of said crenelated gate electrode is less than or substantially equal to the length of each of said trenches.

18. The device of claim 10, wherein said crenelated gate electrode has a width and a length, and wherein the length of said crenelated gate electrode is greater than the length of each of said trenches.

19. The device of claim 10, said device further comprising a layer having a dielectric material, said layer located on at least a portion of said superlattice structure.

20. A device comprising:

an epitaxial structure comprising a superlattice structure having an upper 2DxG channel and a lower 2DxG channel, said lower 2DxG channel induced by the presence of a first delta doping layer;

a source electrode having a first length edge, a second length edge, a front width edge and a back width edge, said source electrode located over said upper 2DxG channel and ohmically connected to each of said 2DxG channels;

a drain electrode having a first length edge, a second length edge, a front width edge and a back width edge, said drain electrode located over said upper 2DxG channel and ohmically connected to each of said 2DxG channels;

a first current-flow boundary positioned between the first length edge of said source electrode and the first length edge of said drain electrode;

a second current-flow boundary positioned between the second length edge of said source electrode and the second length edge of said drain electrode, wherein said first current-flow boundary and said second current-flow boundary substantially preclude current flow between said source electrode and said drain electrode outside of the area defined by said first current-flow boundary and said second current-flow boundary;

at least one trench located between said source electrode and said drain electrode, said trench having a length, a width and a depth defining a first sidewall surface, a second sidewall surface and a bottom surface located therebetween, the bottom surface of said trench being at or below the lower 2DxG channel; and a gate electrode located over said upper 2DxG channel, said gate electrode located within said trench, said gate electrode having a top and a bottom surface, the bottom surface of said gate electrode being in juxtaposition with the first sidewall surface, the bottom surface and the second sidewall surface of said trench:

wherein all of said 2DxG channels are either 2DEG channels or 2DHG channels, thereby creating a unipolar device.

\* \* \* \* \*